United States Patent
Moujbani

(10) Patent No.: US 11,249,038 B2
(45) Date of Patent: Feb. 15, 2022

(54) APPARATUS AND METHOD FOR SELECTIVE INFLOW CONTROL USING NUCLEAR MAGNETIC RESONANCE MEASUREMENTS FOR HYDROCARBON PRODUCTION WITHOUT WATER

(71) Applicant: Mohamed Aymen Moujbani, Celle (DE)

(72) Inventor: Mohamed Aymen Moujbani, Celle (DE)

(73) Assignee: BAKER HUGHES OILFIELD OPERATIONS LLC, Houston, TX (US)

(*) Notice: Subject to any disclaimer, the term of this patent is extended or adjusted under 35 U.S.C. 154(b) by 133 days.

(21) Appl. No.: 16/698,384

(22) Filed: Nov. 27, 2019

(65) Prior Publication Data

US 2021/0156811 A1    May 27, 2021

(51) Int. Cl.
*G01N 24/08* (2006.01)
*E21B 43/12* (2006.01)
*G01V 3/32* (2006.01)
*G01R 33/30* (2006.01)

(52) U.S. Cl.
CPC ......... *G01N 24/085* (2013.01); *E21B 43/121* (2013.01); *G01N 24/082* (2013.01); *G01R 33/307* (2013.01); *G01V 3/32* (2013.01)

(58) Field of Classification Search
CPC .. E21B 43/121; G01N 24/082; G01N 24/085; G01N 24/081; G01V 3/32; G01R 33/307; Y02A 90/30
See application file for complete search history.

(56) References Cited

U.S. PATENT DOCUMENTS

| | | | |
|---|---|---|---|
| 6,684,952 B2* | 2/2004 | Brockman | E21B 17/028 166/250.03 |
| 2012/0152562 A1* | 6/2012 | Newton | E21B 43/12 166/369 |
| 2012/0310553 A1* | 12/2012 | Ong | G01V 3/32 702/49 |
| 2016/0145975 A1* | 5/2016 | Carroll | H02K 7/1823 166/244.1 |

* cited by examiner

*Primary Examiner* — Jay Patidar
(74) *Attorney, Agent, or Firm* — Cantor Colburn LLP

(57) ABSTRACT

An apparatus for extracting a fluid from a formation includes an inflow control device (ICD) coupled to a production tubular disposed in a borehole penetrating the formation and configured to control flow into the production tubular and a nuclear magnetic resonance (NMR) front-end component assembly disposed in the borehole, the NMR front-end component assembly having a sensitive volume in a flow path leading to and/or coming through the ICD. The apparatus also includes a controller receiving input from an NMR electronics module coupled to the NMR front-end component assembly and providing output to the ICD based on the input from the NMR electronics module.

20 Claims, 4 Drawing Sheets

APPARATUS AND METHOD FOR SELECTIVE INFLOW CONTROL USING NUCLEAR MAGNETIC RESONANCE MEASUREMENTS FOR HYDROCARBON PRODUCTION WITHOUT WATER

BACKGROUND

Hydrocarbons are typically extracted using a production tubular that penetrates a reservoir in a subsurface formation. The production tubular has openings providing a fluid communication with the reservoir and through at least some of which hydrocarbons may enter the tubular. Some reservoirs however have regions or pockets of water and if the production tubular is located in a water region, then water can also enter the production tubular and be pumped to the surface. Unfortunately, extracting both hydrocarbon and water through the production tubular can increase the cost of hydrocarbon production as the hydrocarbon must be separated from the water at the surface. Hence, it would be well received in the hydrocarbon recovery industry if techniques were developed to improve hydrocarbon production.

BRIEF SUMMARY

Disclosed is an apparatus for extracting a fluid from a formation, the apparatus includes: an inflow control device (ICD) coupled to a production tubular disposed in a borehole penetrating the formation and configured to control flow into the production tubular; a nuclear magnetic resonance (NMR) front-end component assembly disposed in the borehole, the NMR front-end component assembly having a sensitive volume in a flow path leading to and/or coming through the ICD; and a controller receiving input from an NMR electronics module coupled to the NMR front-end component assembly and providing output to the ICD based on the input from the NMR electronics module.

Also disclosed is a method for extracting a fluid from a formation, the method includes: performing a nuclear magnetic resonance (NMR) measurement with a sensitive volume in a flow path leading to and/or coming through an inflow control device (ICD) coupled to a production tubular disposed in a borehole penetrating the formation using an NMR front-end component assembly disposed in the borehole to provide NMR data; and controlling the ICD based on the NMR data.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method presented herein by way of exemplification and not limitation with reference to the figures.

Disclosed are embodiments of apparatuses and methods for producing hydrocarbons such as oil from a reservoir in a formation using a production tubular in which water intrusion is prevented or limited. The embodiments involve having inflow control devices (ICDs) at multiple locations along a production tubular and a nuclear magnetic resonance (NMR) front-end component assembly located in proximity to each ICD. The NMR front-end component assembly includes at least a magnet and an antenna. Alternatively, the earth's magnetic field may be used in lieu of or in addition to the magnetic field of the magnet. Each NMR front-end component assembly has a sensitive volume leading to and/or through the corresponding ICD. For example, the sensitive volume may be in the production tubular downstream of the corresponding ICD or in the formation near to an inlet of the corresponding ICD. By interrogating the sensitive volume, the presence of hydrocarbons or water that is being introduced or can be introduced into the corresponding ICD can be identified. ICDs that have or can have water introduced into them can be remotely closed and ICDs that have or can have hydrocarbons introduced into them can be remotely opened. As a result, the production tubular will extract only or mostly hydrocarbons without water contamination.

Figure 1:
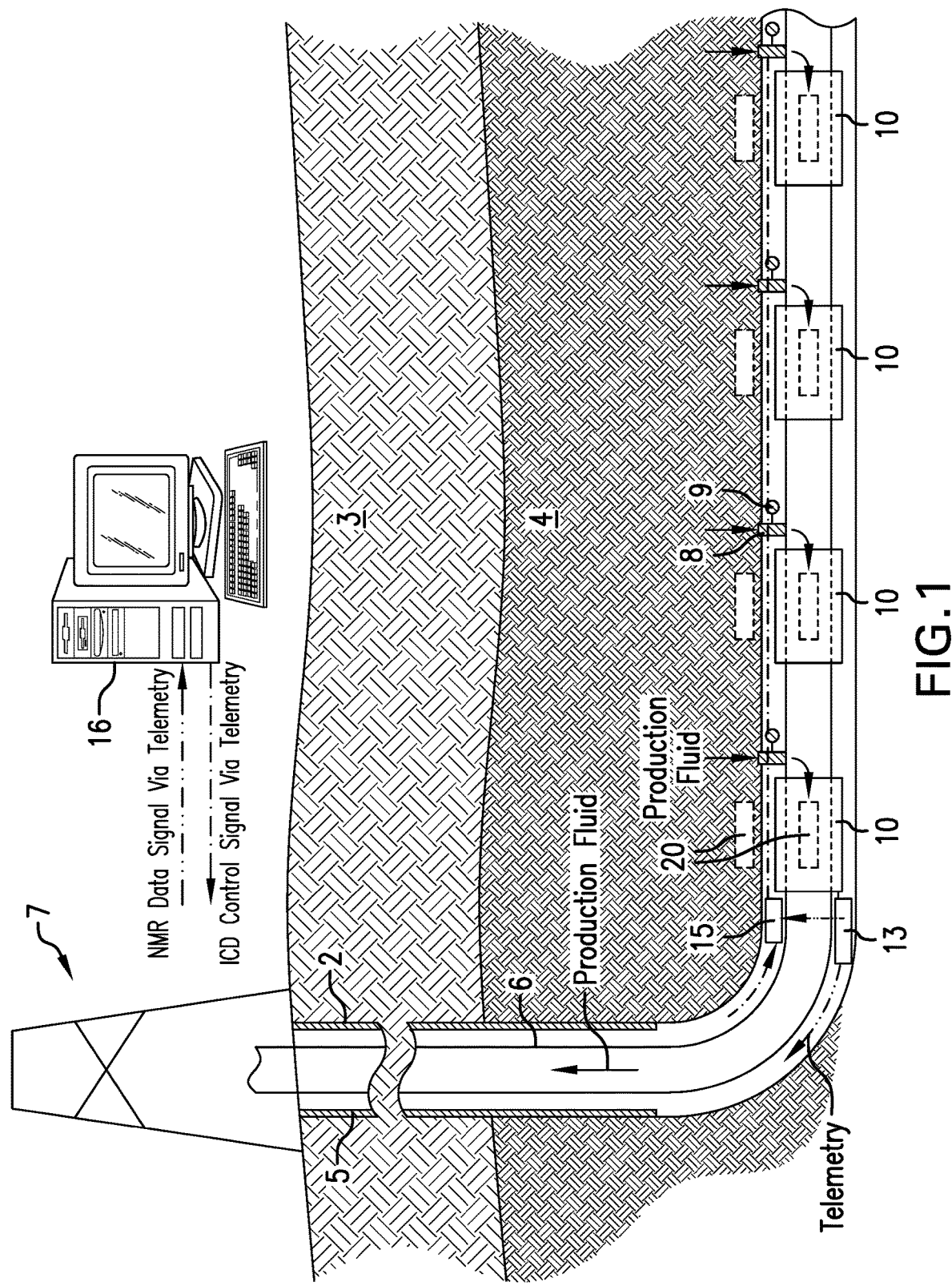
FIG. 1 is a cross-sectional view of an embodiment of a production tubular disposed in a borehole penetrating a formation.

FIG. 1 illustrates a cross-sectional view of a borehole 2 penetrating the earth 3 having a formation 4, which contains a reservoir of hydrocarbons. The borehole 2 is lined with a casing 5. A production tubular 6 is disposed within the casing 5. Surface production equipment 7 is disposed at the surface of the earth and is configured to extract and process extracted hydrocarbons such as oil. The production equipment 7 may include pumps, valves, piping, filtering, and storage facilities. The production tubular 6 includes multiple inflow control devices (ICDs) 8, such as valves, through which formation fluids can enter the production tubular 6. Each ICD 8 includes an actuator 9 to remotely open or close the ICD 8. In one or more embodiments, the actuator 9 is an electro-mechanical actuator that converts electric power to mechanical movement of the ICD 8. Other types of actuators may also be used such as pneumatic actuators and hydraulic actuators. Each ICD 8 can be controlled by a downhole controller 15 and/or by a surface controller 16 such as a computer processing system.

A nuclear magnetic resonance (NMR) front-end component assembly 10 is located in proximity of each ICD 8 such that each NMR front-end component assembly 10 has a sensitive volume that is located downstream of the corresponding ICD 8 and/or in a region of the formation 4 that can supply formation fluid to the corresponding ICD 8. It can be appreciated that the closer the sensitive volume is to the corresponding ICD 8, the lesser the likelihood (or amount) of unwanted formation fluid such as water entering the production tubular 7.

Figure 2:
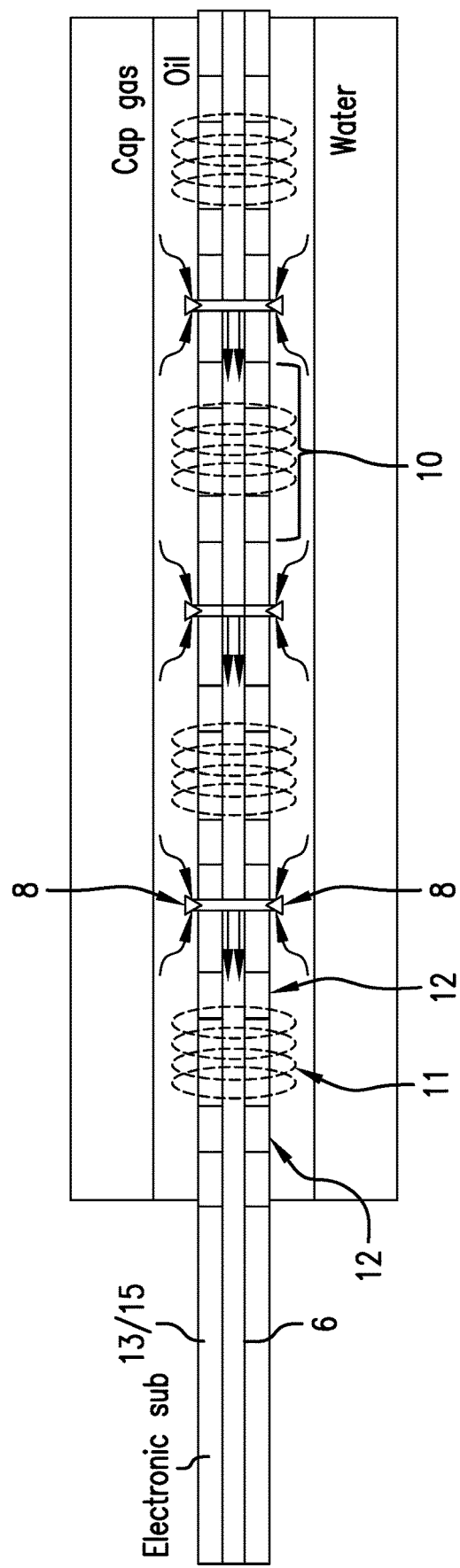
FIG. 2 depicts aspects of an embodiment of a plurality of nuclear magnetic resonance (NMR) front-end component assemblies having a sensitive volume in the production tubular.
Figure 3:
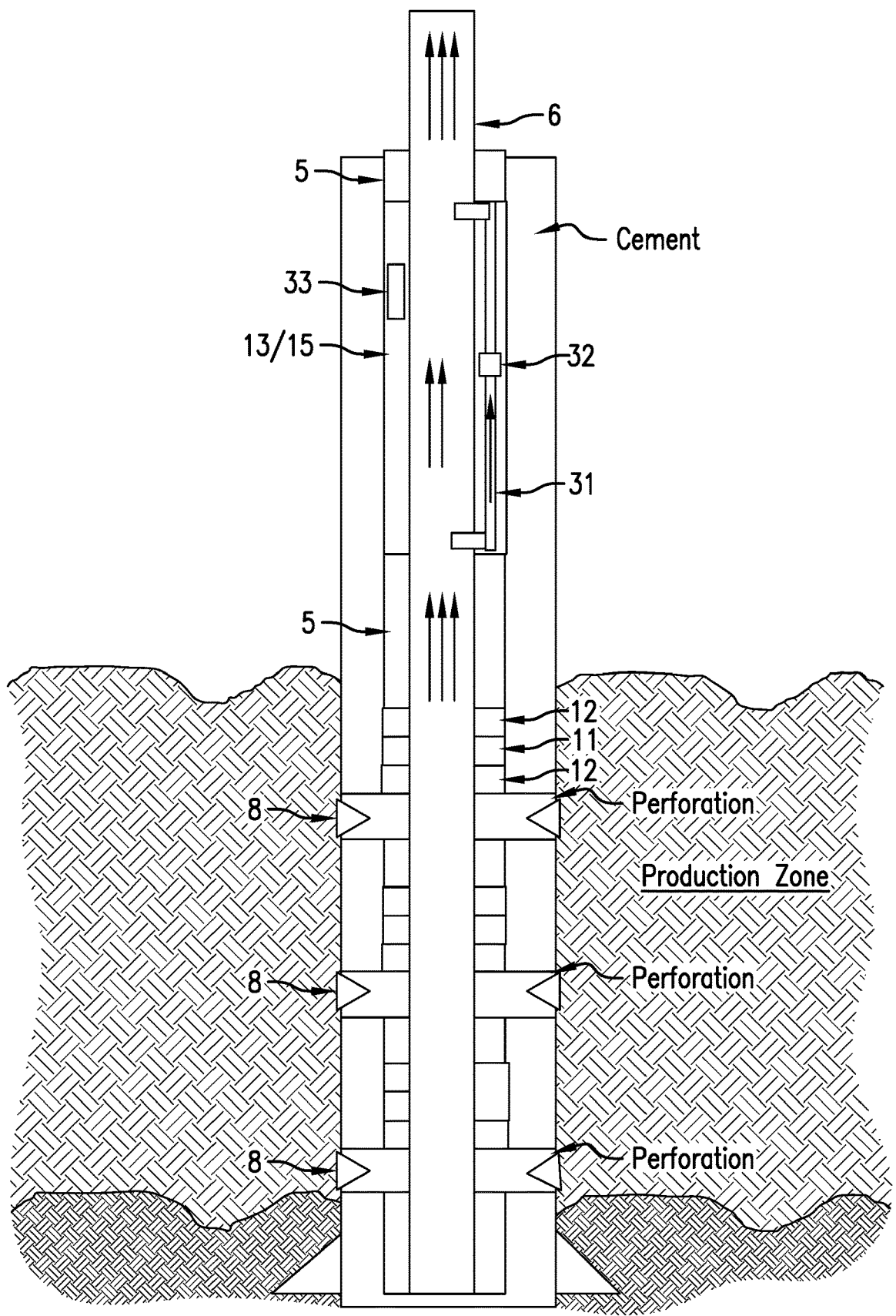
FIG. 3 depicts aspects of another embodiment having a plurality of NMR front-end component assemblies.

Each NMR front-end component assembly 10 includes an antenna (see antenna 11 in FIGS. 2 and 3) and a magnet (see magnet 12 in FIGS. 2 and 3). The magnet is configured to impose a magnetic field in a location referred to as a sensitive volume 20 in which an NMR experiment or measurement is performed. To be clear, the term "sensitive volume" relates to a spatial volume in which an NMR experiment or measurement is performed to determine a property of a material inside of the volume. The magnetic field polarizes nuclear spins of nuclei such as protons in the sensitive volume. The antenna is configured to transmit a series of precisely timed bursts or pulses of radio-frequency (RF) electromagnetic energy to the nuclear spins in the sensitive volume 20 to cause them to precess in the magnetic field. The antenna is also configured to receive NMR signals due to the precession of the nuclei in order to perform the NMR experiment or measurement. A downhole NMR electronics module 13 is coupled to the antenna and configured to transmit the RF pulses and receive the NMR signals via the antenna.

As a result of the interaction of the RF pulses with the nuclear spins, the nuclear spins precess at what is known as the Larmor frequency and generate alternating magnetic fields. The alternating magnetic fields known as echoes induce the NMR signals in the antenna. The NMR signals are received by the downhole NMR electronics module 13 coupled to the antenna. The downhole NMR electronics module 13 includes a processing circuit that is configured to output calibrated NMR signal measurements of the material in the sensitive volume using the NMR signals.

Long trains of echoes or echo trains can be recorded. The decays of the echo trains are caused by the so-called T2 relaxation, also known as transverse or spin-spin relaxation. The NMR measurements yield transverse relaxation times T2, which are exponential decay time constants that correspond to a characteristic or property of the material in the sensitive volume. Transverse relaxation relates to the loss of phase coherence of the nuclei or protons in the sensitive volume while precessing about the static magnetic field during an NMR measurement or experiment. There is not one single value of T2 for formation fluids but a wide distribution of values lying anywhere between fractions of a millisecond and several seconds for example. The quantitative distribution of T2 values is the principal output of the downhole NMR electronics module 13. In alternative embodiments, low field NMR may be used and/or T1 relaxation values may be output from the downhole NMR electronics module 13. In that NMR tools for obtaining a quantitative distribution of T2 values and/or T1 values are known in the art, they are not discussed herein in further detail.

From the quantitative distribution of T2 values, the material within the sensitive volume can be identified as being water or hydrocarbons by the downhole NMR electronics module 13, the controller 15, and/or 16 by comparing the quantitative distribution of T2 values to reference standards for hydrocarbons (e.g., oil) and water for example. The reference standards can be obtained by testing and/or by analysis using NMR data known in the art.

A signal identifying the material in the sensitive volume can be transmitted by telemetry, such as a fiber optic cable in a non-limiting embodiment, to the downhole controller 15 and/or the surface controller 16. The downhole controller 15 and/or the surface controller 16 are configured to open ICDs 8 whose sensitive volume contains hydrocarbons and to close ICDs 8 whose sensitive volume contains water based on the quantitative distribution of T2 values that identify the reservoir fluid. Communication between the downhole controller 15 and/or the surface controller 16 and the corresponding ICDs 8 can be by optical signal and/or electrical signal using an appropriate medium in non-limiting embodiments.

It can be appreciated that there may be a single downhole NMR electronics module 13 for each NMR front-end component assembly 10 or there may be a single downhole NMR electronics module 13 for a certain number of NMR front-end component assemblies 10. In embodiments having multiple NMR front-end component assemblies 10 associated with a single downhole NMR electronics module 13, the module 13 can be switched to each assembly 10 in a sequence so that NMR data is obtained from all associated assemblies 10.

FIG. 2 depicts aspects of an embodiment of a plurality of NMR front-end component assemblies 10 having the sensitive volume 20 inside the production tubular 6. In the embodiment of FIG. 2, an antenna 11 is a coil of a conductor wrapped around the production tubular 7. Similarly, a magnet 12 includes two magnets with each of the magnets 12 wrapped around the production tubular 7 and imposing a magnetic field inside the production tubular 7 in the sensitive volume. In this embodiment, the downhole NMR electronics module 13 is embodied as an electronic sub and is coupled to the multiple NMR front-end component assemblies 10 illustrated. In an alternative embodiment, the NMR front-end component assemblies 10 may be configured to have their sensitive volumes external to the production tubular 7 in the vicinity of an inlet of each corresponding ICD 8. As such, each antenna 11 may have its centerline axis rotated 90° from the axes illustrated in FIG. 2. Similarly, the magnets 12 may have their magnetization rotated 90° to magnetize the external sensitive volume.

FIG. 3 depicts aspects of another embodiment having a plurality of NMR front-end component assemblies 10. FIG. 3 illustrates the casing 5 being cemented in place with perforations through the casing 5 and cement where the ICDs 8 have inlets. In the embodiment of FIG. 3, the ICDs 8 are electro-mechanical valves. In the embodiment of FIG. 3, electrical power is supplied locally by a small turbine generator 32 that is powered by a flow of production fluid through a flow diverter 31. Alternatively or in addition to the generator 32, a battery 33 may supply the electrical power. The sensitive volumes 20 may be within or external to the production tubular 7 depending on the orientation of the NMR front-end component assemblies 10.

Figure 4:
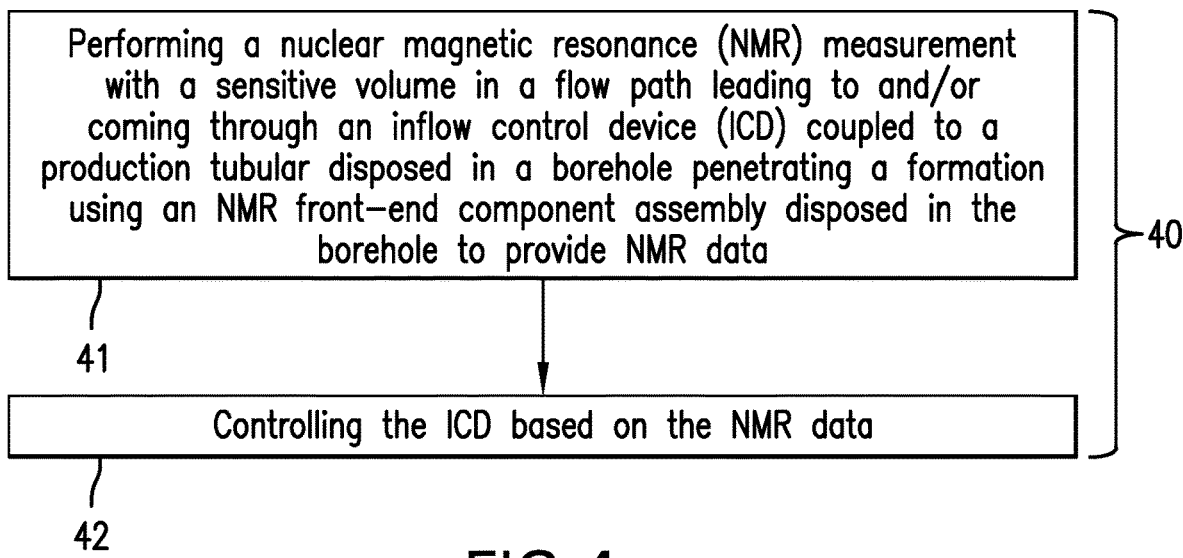
FIG. 4 is a flow chart for a method for controlling inflow into a production tubular.

FIG. 4 is a flow chart for a method 40 for extracting a fluid from a formation. Block 41 calls for performing a nuclear magnetic resonance (NMR) measurement with a sensitive volume in a flow path leading to and/or coming through an inflow control device (ICD) coupled to a production tubular disposed in a borehole penetrating the formation using an NMR front-end component assembly disposed in the borehole to provide NMR data. The sensitive volume may be at least one of (i) within the production tubular and downstream of the ICD (i.e., flow path coming through the ICD) and (ii) in a region having an inlet to the ICD (i.e., flow path leading to the ICD). The NMR front-end component assembly may be disposed in the vicinity of the ICD (such as within 10 feet) and may include at least a magnet to provide a static magnetic field in the sensitive volume and an antenna to transmit RF energy into the sensitive volume and receive NMR signals from the sensitive volume. Alternatively, the earth's magnetic field may be used to provide the static magnetic field and the front-end component assembly may include the antenna and not the magnet. The ICD may include a plurality of ICDs with each ICD having an associated NMR front-end component assembly. For example, if there are ten ICDs, then there will be at least ten NMR front-end component assemblies.

Block 42 calls for controlling the ICD based on the NMR data. Controlling the ICD may include closing the ICD when the NMR measurement indicates water is in the sensitive volume and opening the ICD when the NMR measurement indicates hydrocarbons such as oil are in the sensitive volume. In one or more embodiments, the ICD is controlled automatically by a controller that receives the NMR data from an NMR electronic module that is coupled to the NMR front-end component assembly.

The method 40 may also include pumping the fluid that enters the production tubular to the surface.

The method 40 may also include imposing a magnetic field in the sensitive volume using a magnet that surrounds the production tubular and/or the earth's magnetic field.

The method 40 may also include transmitting a series of radio-frequency electromagnetic pulses into the sensitive volume using an antenna having a coil of conductive material that surrounds the production tubular and receiving NMR signals from the sensitive volume using the antenna.

In the method 40, the ICD may be embodied as a remotely-controlled valve having an actuator and the method 40 may also include sending a signal to the actuator to open the remotely-controlled valve in response the NMR data indicating hydrocarbons are in the sensitive volume.

In the method 40, the ICD may be embodied as a remotely-controlled valve having an actuator and the method 40 may also include sending a signal to the actuator to close the remotely-controlled valve in response the NMR data indicating water is in the sensitive volume.

The method 40 may also include generating electric power using a turbine-generator disposed in a path of a flow diverter coupled to the production tubular, the turbine-generator being coupled to an NMR electronics module that operates the NMR front-end component assembly.

The disclosure herein provides several advantages. One advantage is that only the type of fluid desired (e.g., oil) will be extracted from the formation, thus eliminating or reducing the need and associated cost to separate other types of fluid (e.g., water) from the desired fluid at the surface. Another advantage is that only NMR front-end component assemblies are required at each of the ICDs, thus obviating the need and associated cost of having separate dedicated NMR electronics modules associated with each ICD. Another advantage is when using water injection to increase the oil recovery. In this case, the advantage to using this method is early detection of when the injected water is flooding the reservoir, thereby saving time and costs.

Set forth below are some embodiments of the foregoing disclosure:

Embodiment 1: An apparatus for extracting a fluid from a formation, the apparatus comprising: an inflow control device (ICD) coupled to a production tubular disposed in a borehole penetrating the formation and configured to control flow into the production tubular, a nuclear magnetic resonance (NMR) front-end component assembly disposed in the borehole, the NMR front-end component assembly having a sensitive volume in a flow path leading to and/or coming through the ICD, and a controller receiving input from an NMR electronics module coupled to the NMR front-end component assembly and providing output to the ICD based on the input from the NMR electronics module.

Embodiment 2: The apparatus according to any previous embodiment, wherein the sensitive volume is at least one of (i) within the production tubular and downstream of the ICD and (ii) a region having an inlet to the ICD.

Embodiment 3: The apparatus according to any previous embodiment, wherein the NMR front-end component assembly comprises a magnet.

Embodiment 4: The apparatus according to any previous embodiment, wherein the magnet surrounds the production tubular.

Embodiment 5: The apparatus according to any previous embodiment, wherein the NMR front-end component assembly comprises an antenna.

Embodiment 6: The apparatus according to any previous embodiment, wherein the antenna comprises a coil of a conductive material surrounding the production tubular.

Embodiment 7: The apparatus according to any previous embodiment, wherein the inflow control device comprises a remotely-controlled valve.

Embodiment 8: The apparatus according to any previous embodiment, wherein the remotely-controlled valve comprises an electro-mechanical actuator.

Embodiment 9: The apparatus according to any previous embodiment, further comprising a flow diverter coupled to the production tubular to divert flow from the production tubular and a turbine-generator disposed in a path of the flow diverter to generate electric power.

Embodiment 10: A method for extracting a fluid from a formation, the method comprising: performing a nuclear magnetic resonance (NMR) measurement with a sensitive volume in a flow path leading to and/or coming through an inflow control device (ICD) coupled to a production tubular disposed in a borehole penetrating the formation using an NMR front-end component assembly disposed in the borehole to provide NMR data, and controlling the ICD based on the NMR data.

Embodiment 11: The method according to any previous embodiment, wherein the sensitive volume is at least one of (i) within the production tubular and downstream of ICD and (ii) a region having an inlet to the ICD.

Embodiment 12: The method according to any previous embodiment, further comprising imposing a magnetic field in the sensitive volume using a magnet that surrounds the production tubular and/or using the earth's magnetic field in the sensitive volume.

Embodiment 13: The method according to any previous embodiment, further comprising transmitting a series of radio-frequency electromagnetic pulses into the sensitive volume using an antenna having a coil of conductive material that surrounds the production tubular and receiving NMR signals from the sensitive volume using the antenna.

Embodiment 14: The method according to any previous embodiment, wherein the ICD comprises a remotely-controlled valve having an actuator and the method further comprises sending a signal to the actuator to open the remotely-controlled valve in response the NMR data indicating hydrocarbons are in the sensitive volume.

Embodiment 15: The method according to any previous embodiment, wherein the hydrocarbons comprise oil.

Embodiment 16: The method according to any previous embodiment, wherein the ICD comprises a remotely-controlled valve having an actuator and the method further comprises sending a signal to the actuator to close the remotely-controlled valve in response the NMR data indicating water is in the sensitive volume.

Embodiment 17: The method according to any previous embodiment, further comprising generating electric power using a turbine-generator disposed in a path of a flow diverter coupled to the production tubular and/or a battery, the turbine-generator and/or battery being coupled to an NMR electronics module that operates the NMR front-end component assembly.

In support of the teachings herein, various analysis components may be used, including a digital and/or an analog system. For example, the downhole NMR electronics module 13, the downhole controller 15, and/or the surface controller 16 may include digital, analog, and/or optical systems. The system may have components such as a processor, storage media, memory, input, output, communications link (wired, wireless, optical or other), user interfaces (e.g., a display or printer), software programs, signal processors (digital or analog) and other such components (such as resistors, capacitors, inductors and others) to provide for operation and analyses of the apparatus and methods disclosed herein in any of several manners well-appreciated in the art. It is considered that these teachings may be, but need not be, implemented in conjunction with a set of computer executable instructions stored on a non-transitory computer readable medium, including memory (ROMs, RAMs), optical (CD-ROMs), or magnetic (disks, hard drives), or any other type that when executed causes a computer to implement the method of the present invention. These instructions may provide for equipment operation, control, data collection and analysis and other functions deemed relevant by a system designer, owner, user or other such personnel, in addition to the functions described in this disclosure.

Further, various other components may be included and called upon for providing for aspects of the teachings herein. For example, a power supply, magnet, electromagnet, sensor, electrode, transmitter, receiver, transceiver, antenna, controller, optical unit or components, electrical unit, electrochemical unit, battery, energy storage unit, or electromechanical unit may be included in support of the various aspects discussed herein or in support of other functions beyond this disclosure.

Elements of the embodiments have been introduced with either the articles "a" or "an." The articles are intended to mean that there are one or more of the elements. The terms "including" and "having" and the like are intended to be inclusive such that there may be additional elements other than the elements listed. The conjunction "or" when used with a list of at least two terms is intended to mean any term or combination of terms. The term "configured" relates one or more structural limitations of a device that are required for the device to perform the function or operation for which the device is configured.

The flow diagram depicted herein is just an example. There may be many variations to this diagram or the steps (or operations) described therein without departing from the scope of the invention. For example, operations may be performed in another order or other operations may be performed at certain points without changing the specific disclosed sequence of operations with respect to each other. All of these variations are considered a part of the claimed invention.

The disclosure illustratively disclosed herein may be practiced in the absence of any element which is not specifically disclosed herein.

While one or more embodiments have been shown and described, modifications and substitutions may be made thereto without departing from the scope of the invention. Accordingly, it is to be understood that the present invention has been described by way of illustrations and not limitation.

It will be recognized that the various components or technologies may provide certain necessary or beneficial functionality or features. Accordingly, these functions and features as may be needed in support of the appended claims and variations thereof, are recognized as being inherently included as a part of the teachings herein and a part of the invention disclosed.

While the invention has been described with reference to exemplary embodiments, it will be understood that various changes may be made and equivalents may be substituted for elements thereof without departing from the scope of the invention. In addition, many modifications will be appreciated to adapt a particular instrument, situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. An apparatus for extracting a fluid from a formation, the apparatus comprising:
    an inflow control device (ICD) coupled to a production tubular disposed in a borehole penetrating the formation and configured to control flow into the production tubular;
    a nuclear magnetic resonance (NMR) front-end component assembly disposed in the borehole and in proximity to the ICD, the NMR front-end component assembly having a sensitive volume in a flow path leading to and/or coming through the ICD and comprising a magnet to impose a magnetic field in the sensitive volume and an antenna and;
    an NMR electronics module in signal communication with the NMR front-end component assembly and configured to transmit radio-frequency pulses and receive NMR signals via the antenna, the NMR electronics module being disposed remote to the NMR front-end component assembly; and
    a controller receiving input from the NMR electronics module and providing output to the ICD based on the input from the NMR electronics module.

2. The apparatus according to claim 1, wherein the sensitive volume is at least one of (i) within the production tubular and downstream of the ICD and (ii) a region having an inlet to the ICD.

3. The apparatus according to claim 1, wherein the magnet comprises a first magnet and a second magnet disposed a distance from the first magnet.

4. The apparatus according to claim 3, wherein the first magnet and the second magnet surround the production tubular.

5. The apparatus according to claim 3, wherein the antenna is disposed between the first magnet and the second magnet.

6. The apparatus according to claim 5, wherein the antenna comprises a coil of a conductive material surrounding the production tubular.

7. The apparatus according to claim 1, wherein the inflow control device comprises a remotely-controlled valve.

8. The apparatus according to claim 7, wherein the remotely-controlled valve comprises an electro-mechanical actuator.

9. The apparatus according to claim 1, further comprising a flow diverter coupled to the production tubular to divert flow from the production tubular and a turbine-generator disposed in a path of the flow diverter to generate electric power.

10. The apparatus according to claim 1, wherein the ICD comprises a plurality of ICDs with each ICD in the plurality having an associated NMR front-end component assembly and the NMR electronics module is a single NMR electronics module configured to operate the associated NMR front-end component assembly with each of the ICDs.

11. The apparatus according to claim 1, wherein the NMR electronics module is disposed in a sub in line with the production tubular.

12. A method for extracting a fluid from a formation, the method comprising:

performing a nuclear magnetic resonance (NMR) measurement with a sensitive volume in a flow path leading to and/or coming through an inflow control device (ICD) coupled to a production tubular disposed in a borehole penetrating the formation using an NMR front-end component assembly disposed in the borehole and in proximity to the ICD to provide NMR data, the NMR front-end component assembly comprising a magnet to impose a magnetic field in the sensitive volume and an antenna, wherein performing comprises transmitting radio-frequency pulses and receiving the NMR signals via the antenna using an NMR electronics module disposed remote to the NMR front-end component assembly; and controlling the ICD based on the NMR data.

13. The method according to claim 12, wherein the sensitive volume is at least one of (i) within the production tubular and downstream of ICD and (ii) a region having an inlet to the ICD.

14. The method according to claim 12, wherein the magnet comprises a first magnet and a second magnet disposed a distance from the first magnet and the first magnet and the second magnet surrounds the production tubular.

15. The method according to claim 14, wherein the antenna comprises a coil of conductive material that surrounds the production tubular.

16. The method according to claim 12, wherein the ICD comprises a remotely-controlled valve having an actuator and the method further comprises sending a signal to the actuator to open the remotely-controlled valve in response to the NMR data indicating hydrocarbons are in the sensitive volume.

17. The method according to claim 16, wherein the hydrocarbons comprise oil.

18. The method according to claim 12, wherein the ICD comprises a remotely-controlled valve having an actuator and the method further comprises sending a signal to the actuator to close the remotely-controlled valve in response to the NMR data indicating water is in the sensitive volume.

19. The method according to claim 12, further comprising generating electric power using a turbine-generator disposed in a path of a flow diverter coupled to the production tubular and/or a battery, the turbine-generator and/or battery being coupled to an NMR electronics module that operates the NMR front-end component assembly.

20. The method according to claim 12, wherein the NMR electronics module comprises a single NMR electronics module configured to operate a plurality of NMR front-end component assemblies and the performing comprises performing NMR measurements on a plurality of ICDs with each ICD in the plurality having an associated NMR front-end component assembly using the single NMR electronics module.

* * * * *